(12) United States Patent
Shinmura

(10) Patent No.: US 6,358,846 B1
(45) Date of Patent: Mar. 19, 2002

(54) METHOD OF FABRICATING SEMICONDUCTOR DEVICE WITH POLYCIDE GATE STRUCTURE

(75) Inventor: Toshiki Shinmura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/573,913

(22) Filed: May 18, 2000

(30) Foreign Application Priority Data

May 20, 1999 (JP) .......................................... 11-140009

(51) Int. Cl.$^7$ ............................................... H01L 21/44
(52) U.S. Cl. ....................... 438/683; 438/592; 438/649; 438/655
(58) Field of Search ................................ 438/592, 649, 438/643, 655, 656, 683

(56) References Cited

U.S. PATENT DOCUMENTS

| | | | |
|---|---|---|---|
| 5,801,425 A | * 9/1998 | Kuroi et al. ................. | 257/283 |
| 5,849,634 A | 12/1998 | Iwata | |
| 5,869,397 A | * 2/1999 | Miyakawa ................... | 438/655 |
| 5,874,351 A | * 2/1999 | Hu et al. ..................... | 438/527 |
| 5,945,719 A | * 8/1999 | Tsuda ......................... | 257/413 |
| 5,950,083 A | * 9/1999 | Inoue et al. ................. | 438/233 |
| 6,004,872 A | 12/1999 | Tezuka et al. | |
| 6,015,997 A | 1/2000 | Hu et al. | |
| 6,033,978 A | * 3/2000 | Fujii et al. ................... | 438/621 |
| 6,110,811 A | * 8/2000 | Pey ............................. | 438/592 |

FOREIGN PATENT DOCUMENTS

| | | | |
|---|---|---|---|
| EP | 908935 | * | 4/1999 |
| JP | 10-223561 | | 8/1998 |
| JP | 11-40515 | * | 2/1999 |

* cited by examiner

Primary Examiner—Trung Dang

(57) ABSTRACT

A method of fabricating a semiconductor device is provided, which makes it possible to form a $TiSi_2$ polycide gate structure having a crack-free $TiSi_2$ film and which eliminates the process to lower the resistivity of a $TiSi_2$ film. The method comprises the steps of: (a) providing a semiconductor substrate having an active region formed by an isolation dielectric; (b) selectively forming a gate dielectric in the active region; (c) forming a polysilicon film on the gate dielectric; (d) forming a $TiSi_2$ film on the polysilicon film while the substrate is kept at a temperature of approximately 750° C. or higher; and (e) patterning the polysilicon film and the $TiSi_2$ film to form a gate electrode with a polycide structure. In the step (e), no phase transition of $TiSi_2$ from amorphous or C-49 phase to the C-54 phase occurs. A barrier film may be additionally provided between the polysilicon and $TiSi_2$ films. Preferably, the temperature of the substrate has a highest value of approximately 850° C. The step (d) may be carried out by sputtering, CVD, or evaporation.

8 Claims, 6 Drawing Sheets

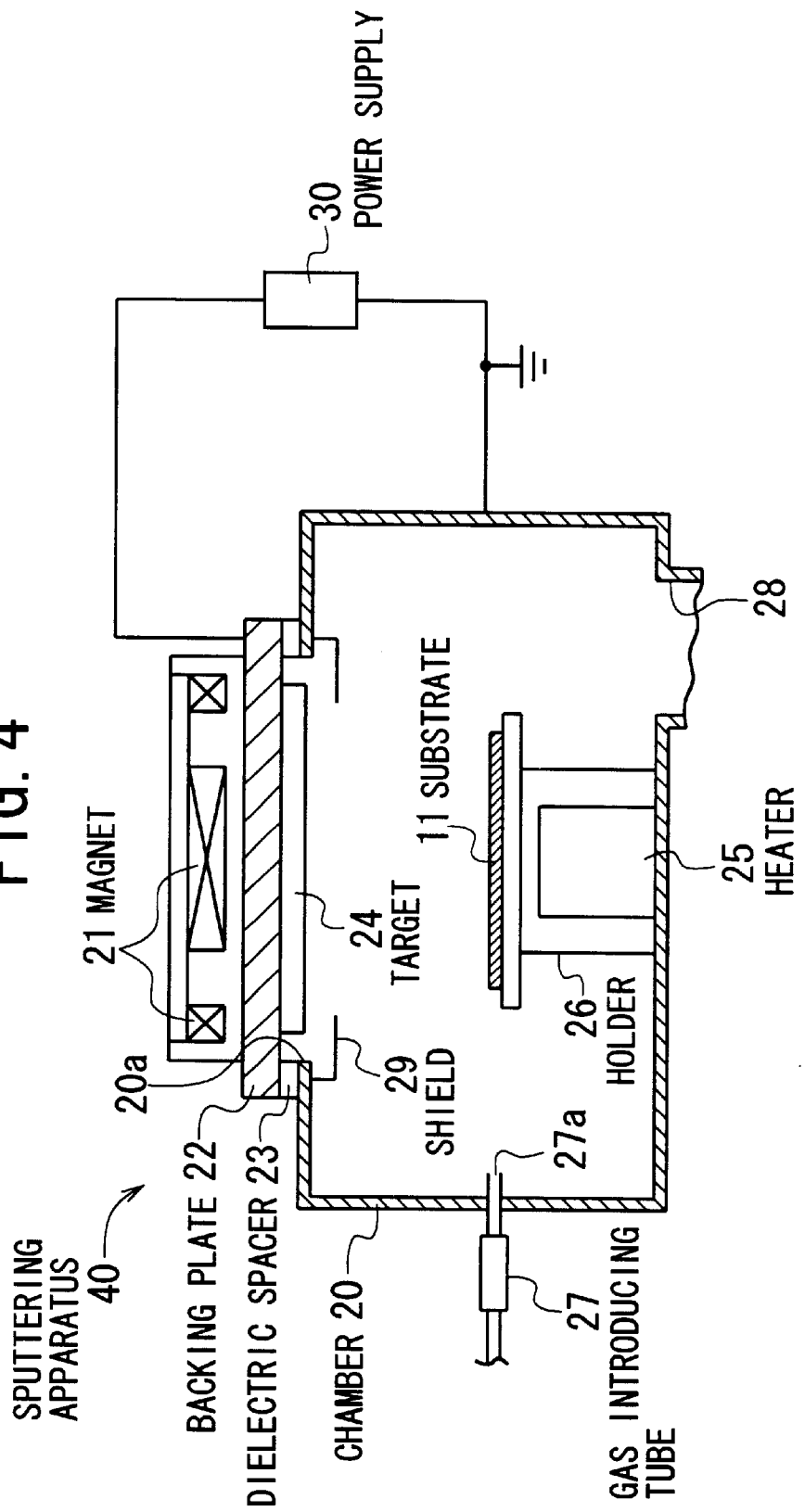

METHOD OF FABRICATING SEMICONDUCTOR DEVICE WITH POLYCIDE GATE STRUCTURE

BACKGROUND OF THE INVENTION

1. Field of the Invention

The present invention relates to a method of fabricating a semiconductor device and more particularly, to a method of fabricating a semiconductor device equipped with a polycide gate structure using titanium silicide ($TiSi_2$).

2. Description of the Related Art

With semiconductor devices with Metal-Oxide-Semiconductor Field-Effect Transistors (MOSFETs), a polycide structure formed by the combination of a polysilicon film and a $TiSi_2$ film has been usually used for gate electrodes and gate wiring lines because they need to be as low as possible in resistivity.

FIGS. 1A and 1B show a prior-art method of forming the polycide gate structure using $TiSi_2$.

First, as shown in FIG. 1A, an isolation dielectric 112 is selectively formed on the surface of a silicon (Si) substrate 111, thereby defining active regions 113 thereon. Then, a thin gate oxide 114 is formed on the exposed areas of the substrate 111 in the active regions 113. A polysilicon film 115 is formed on the gate oxide 114 and the isolation dielectric 112.

Subsequently, using a sputtering apparatus, a titanium silicide ($TiSi_2$) film 131 is formed on the polysilicon film 115 without heating the substrate 111 from its back side. Alternately, the $TiSi_2$ film 131 is formed by a sputtering apparatus while the substrate 111 is held at a temperature of approximately 400° C. to 600° C. by a substrate holder with a heating function. The state at this stage is shown in FIG. 1A.

The $TiSi_2$ film 131 formed by sputtering under the above-described condition is high in resistivity. Specifically, the film 131 formed without heating the substrate 111 from its back side is in the amorphous phase. On the other hand, the film 131 formed while the temperature of the substrate 111 is kept within the range of approximately 400° C. to 600 ° C. is in the C-49 phase. It has been known that amorphous $TiSi_2$ and C49-phase $TiSi_2$ are high in resistivity.

To lower the resistivity of the $TiSi_2$ film 131, the film 131 is typically subjected to a lamp annealing process, i.e., a Rapid Thermal Annealing (RTA) process, at approximately 800° C., thereby transforming the amorphous or C-49 phase into the low-resistivity C-54 phase due to phase transition. Thus, as shown in FIG. 1B, a C-54 phase $TiSi_2$ film 131a is formed on the polysilicon film 115. (This point has been disclosed in, for example, the Japanese Non-Examined Patent Publication No. 10-223561 published in 1998.)

As shown in FIG. 1B, the $TiSi_2$ film 131a has depressions 131aa, which are formed to reflect the depressions of the isolation dielectric 112 located on its top face.

Furthermore, the polysilicon film 115 and the C-54 phase $TiSi_2$ film 131a are patterned to have a specific shape, thereby forming gate electrodes (not shown) with the $TiSi_2$ polycide structure.

With the prior-art method shown in FIGS. 1A and 1B, the volume of the amorphous or C-49 phase $TiSi_2$ film 131 decreases during the phase transition to the C-54 phase from the amorphous or C-49 phase, resulting in tensile stress in the C-54 phase $TiSi_2$ film 131a. As a result, as shown in FIG. 2, there arises a problem that cracks 132 tend to be formed in the film 131a at the bottom of the depressions 131aa. Due to existence of the cracks 132, the underlying polysilicon film 115 will be affected badly in subsequent process steps.

Moreover, the RTA process needs to be additionally performed to form the C-54 phase $TiSi_2$ film 131a through phase transition after the process of forming the amorphous or C-49 phase $TiSi_2$ film 131. Thus, there is another problem that the necessary time period to the fabrication sequence of the semiconductor device increases and its fabrication cost rises.

Accordingly, an object of the present invention is to provide a method of fabricating a semiconductor device equipped with a polycide gate structure that solves the above-identified problems in the prior-art method.

Another object of the present invention is to provide a method of fabricating a semiconductor device that makes it possible to form a polycide gate structure having a crack-free $TiSi_2$ film.

Still another object of the present invention is to provide a method of fabricating a semiconductor device that eliminates the process to lower the resistivity of a $TiSi_2$ film.

A further object of the present invention is to provide a method of fabricating a semiconductor device that lowers its fabrication cost.

The above objects together with others not specifically mentioned will become clear to those skilled in the art from the following description.

A method of fabricating a semiconductor device according to a first aspect of the present invention comprises the steps of:

(a) providing a semiconductor substrate having an active region defined by an isolation dielectric;

(b) selectively forming a gate dielectric in the active region;

(c) forming a polysilicon film on the gate dielectric;

(d) forming a C-54 phase $TiSi_2$ film on the polysilicon film while the substrate is kept at a temperature of approximately 750° C. or higher; and (e) patterning the polysilicon film and the C-54 phase $TiSi_2$ film to form a gate electrode with a polycide structure.

With the method of fabricating a semiconductor device according to the first aspect of the present invention, the $TiSi_2$ film with the low-resistivity C-54 phase is formed on the polysilicon film while the substrate is kept at a temperature of approximately 750° C. or higher in the step (d). In other words, the C-54 phase $TiSi_2$ film is directly formed without phase transition from the high-resistivity amorphous or C-49 phase. Thus, no volume shrinkage, which tends to occur during the phase transition, occurs in the $TiSi_2$ film. As a result, the C-54 phase $TiSi_2$ film contains no cracks, resulting in a polycide gate structure having a crack-free, low-resistivity $TiSi_2$ film.

Also, since the $TiSi_2$ film formed in the step (d) has the low-resistivity C-54 phase, the heat treatment process to cause the phase transition in the $TiSi_2$ film (i.e., to lower the resistivity of the $TiSi_2$ film) is unnecessary. In other words, the necessary time period to the fabrication sequence of the semiconductor device is shortened. Accordingly, the fabrication cost of the semiconductor device is lowered.

A method of fabricating a semiconductor device according to a second aspect of the present invention comprises the steps of:

(a) providing a semiconductor substrate having an active region defined by an isolation dielectric;

(b) selectively forming a gate dielectric in the active region;

(c) forming a polysilicon film on the gate dielectric;

(d) forming a barrier film on the polysilicon film;

(e) forming a C-54 phase $TiSi_2$ film on the barrier film while the substrate is kept at a temperature of approximately 750° C. or higher; and (f) patterning the polysilicon film, the barrier film, and the C-54 phase $TiSi_2$ film to form a gate electrode with a polycide structure.

With the method of fabricating a semiconductor device according to the second aspect of the present invention, because of the same reason as the method of the first aspect, the same advantages as those in the method of the first aspect are given.

In a preferred embodiment of the method according to the first or second aspect of the invention, in the step (d), the temperature of the substrate has a highest value of approximately 850° C. In other words, the step (d) is performed while the substrate is kept at a temperature from approximately 750° C. to approximately 850° C. In this embodiment, there is an additional advantage that the possibility that $TiSi_2$ grows to be like islands due to agglomeration in the step (d) can be eliminated.

In another preferred embodiment of the method according to the first or second aspect of the invention, the step (d) is carried out by sputtering, Chemical Vapor Deposition (CVD), or evaporation. In this embodiment, there is an additional advantage that the process for performing the step (d) can be selected according to the necessity.

BRIEF DESCRIPTION OF THE DRAWINGS

In order that the present invention may be readily carried into effect, it will now be described with reference to the accompanying drawings.

FIG. 4 is a schematic cross-sectional view showing the configuration of a sputtering apparatus used in the method according to the invention.

DETAILED DESCRIPTION OF THE PREFERRED EMBODIMENTS

Figure 1A:
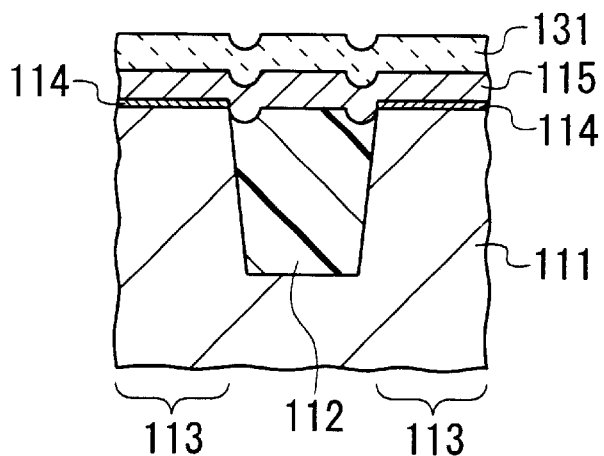
FIGS. 1A and 1B are schematic partial cross-sectional views showing the process steps of a prior-art method of fabricating a semiconductor device with a polycide gate structure.
Figure 1B:
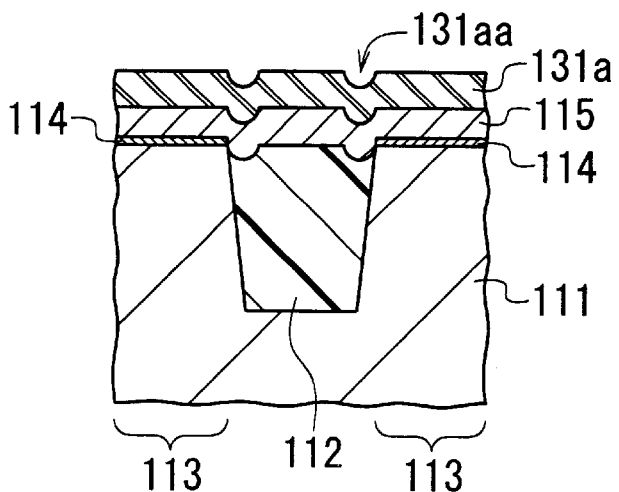
Figure 2:
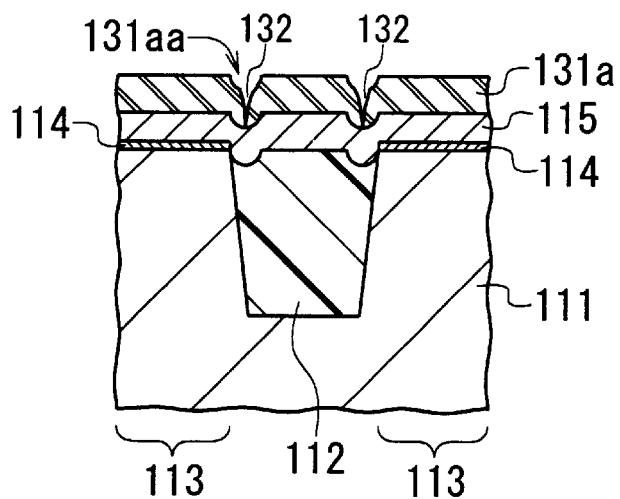
FIG. 2 is a schematic partial cross-sectional view showing the state of the semiconductor device fabricated by the prior-art method of FIGS. 1A and 1B, in which cracks are formed in the $TiSi_2$ film.

Preferred embodiments of the present invention will be described in detail below while referring to the drawings attached.

First Embodiment

A method of fabricating a semiconductor device according to a first embodiment of the invention comprises the process steps as show in FIGS. 3A to 3G.

Figure 3A:
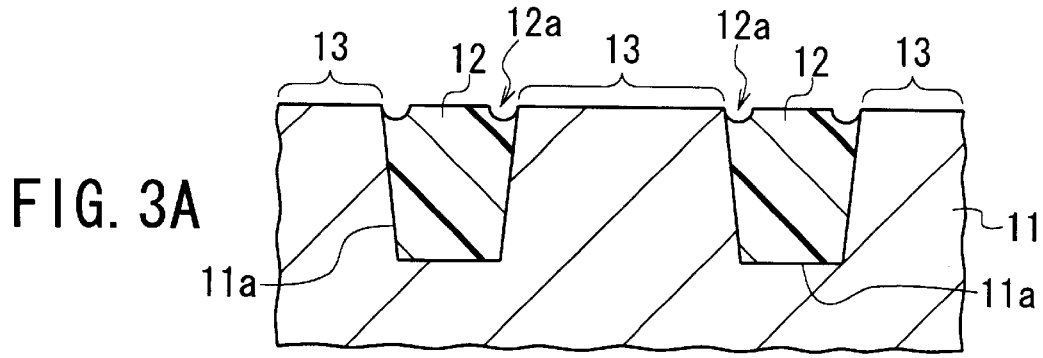
FIGS. 3A to 3G are schematic partial cross-sectional views showing the process steps of a method of fabricating a semiconductor device according to a first embodiment of the present invention, respectively.

First, as shown in FIG. 3A, a single-crystal Si substrate 11 having shallow trenches 11a in its surface is provided. Then, a dielectric film (not shown) is formed on the whole surface of the substrate 11 and then, the dielectric film is etched back so as to remain only in the trenches 11a. Thus, an isolation dielectric 12 is selectively formed in the trenches 11a. The isolation dielectric 12 defines active regions 13 on the surface of the substrate 11.

Through the processes of forming the isolation dielectric 12 in the trenches 11a, unwanted depressions 12a are formed on the top of the dielectric 12. The state at this stage is shown in FIG. 3A.

Figure 3B:
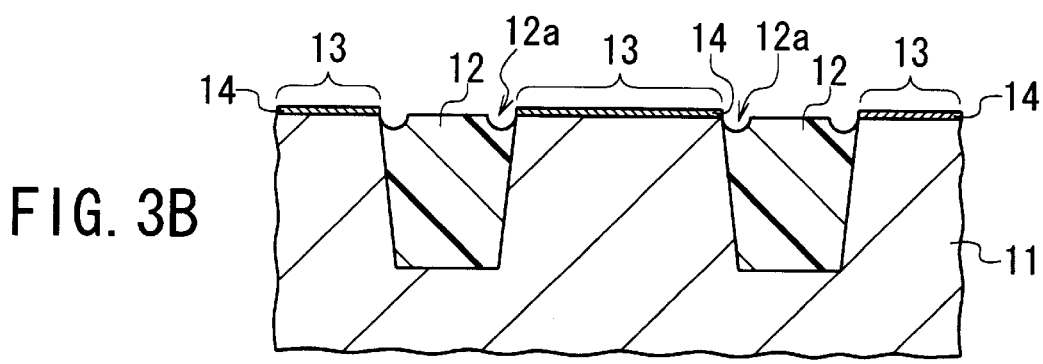

Next, as shown in FIG. 3B, a thin gate oxide 14 (e.g., approximately 7 nm in thickness) is selectively formed on the exposed areas of the substrate 11 in the active regions 13 by thermally oxidizing the substrate 11.

Figure 3C:
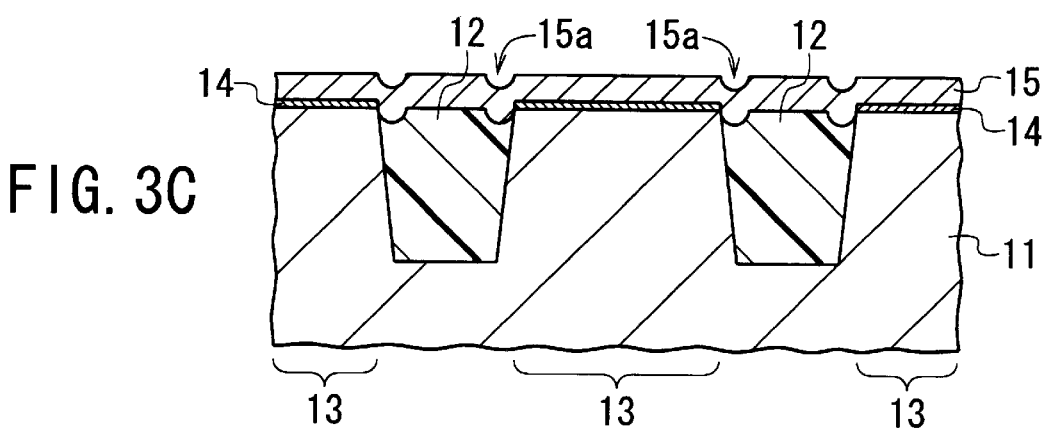

A thick, n-type polysilicon film 15 (e.g., approximately 100 nm in thickness) is formed on the gate oxide 14 and the exposed isolation dielectric 12 over the whole substrate 11 by a CVD method, as shown in FIG. 3C. The film 15 is doped with an n-type dopant such as phosphorus (P) in order to decrease its resistivity. Depressions 15a are formed on the top of the film 15 due to the depressions 12a of the isolation dielectric 12, as shown in FIG. 3C.

Figure 3D:
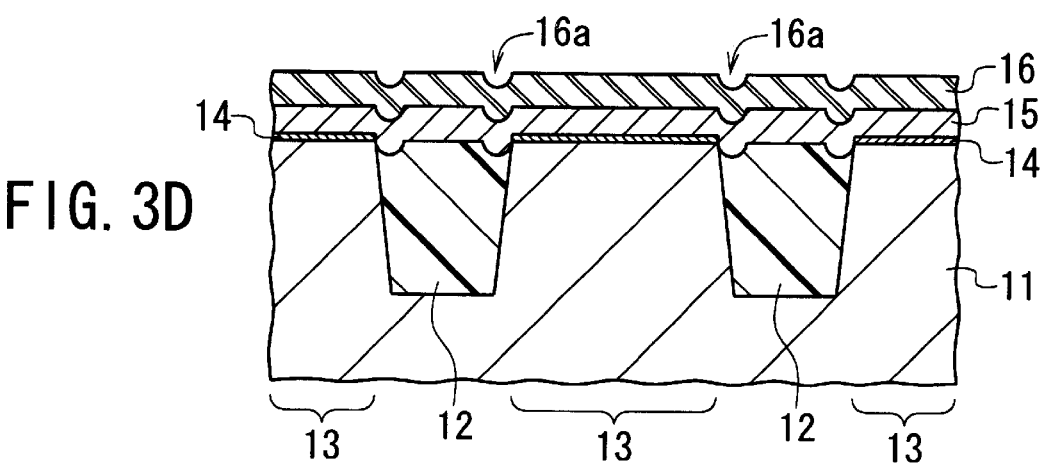

Following this, as shown in FIG. 3D, a titanium silicide ($TiSi_2$) film 16 (e.g., approximately 100 nm in thickness) is formed on the n-type polysilicon film 15 using a sputtering apparatus 40 shown in FIG. 4. Depressions 16a are formed on the top of the film 16 due to the depressions 15a of the polysilicon film 15.

The apparatus 40 is designed to realize fast film formation or deposition using the magnetron sputtering technique and to have a higher heat resistant property. The apparatus 40 has the following configuration.

As shown in FIG. 4, the apparatus 40 includes a sputtering chamber 20 having a top opening 20a. A backing plate 22 is fixed to the top wall of the chamber 20 through a dielectric spacer 23, thereby closing the opening 20a. A magnet 21 is fixed onto the top face of the plate 22, which is located outside the chamber 20. A sputtering target 24 made of an alloy of $TiSi_2$ is attached onto the bottom face of the plate 22, which is located in the chamber 20. A protection shield 29 is provided to extend along the periphery of the opening 20a. The shield 29 covers only the peripheral area of the opening 20a so as to expose the target 24.

In the chamber 20, a substrate holder 26 is provided on the bottom wall of the chamber 20 for holding the substrate 11 to be processed. The substrate 11 is placed on the flat top surface of the holder 26, as shown in FIG. 4. The holder 26 comprises a heater 25 (e.g., a resistance heater) for heating the substrate 11 from its bottom or back face.

A tube 27 is connected to the sidewall of the chamber 20 to introduce a specific sputtering gas into the chamber 20. The mouth or outlet 27a of the tube 27 is located inside the chamber 20 so as to protrude inwardly. An exhaust port 28, through which the sputtering gas in the chamber 20 is discharged, is formed at the bottom wall of the chamber 20.

A power supply 30 is provided outside the chamber 20 to supply specific electric power to the backing plate 22.

When the $TiSi_2$ film 16 is formed on the n-type polysilicon film 15 using the sputtering apparatus 40, the substrate 11 with the structure shown in FIG. 3C is placed on the holder 26. At this time, the bottom or back surface of the substrate 11 is contacted with the holder 26 and the polysilicon film 15 is located just below the target 24. Then, the substrate 11 is heated with the heater 25 of the holder 26 up to a specific temperature within the range of approximately 750° C. to approximately 850° C. Subsequently, while the temperature of the substrate 11 is kept at the specific temperature, the TiSi$_2$ target 24 is sputtered in the chamber 20 for a specific period by active species existing in the chamber 20, thereby depositing TiSi$_2$ onto the polysilicon film 15. Thus, the TiSi$_2$ film 16 is formed on the polysilicon film 15, as shown in FIG. 3D, where the depressions 16a are formed on the top of the film 16.

The reason why the temperature of the substrate 11 is set to be equal to or higher than approximately 750° C. in the above-identified sputtering process is to realize the TiSi$_2$ film 16 with the low-resistivity C-54 phase directly. According to the inventor's experiment, if the temperature of the substrate 11 is lower than approximately 750° C., the TiSi$_2$ film 16 does not have the complete C-54 phase. For example, if the temperature of the substrate 11 is set to be equal to or higher than approximately 350° C. and lower than approximately 750° C., the TiSi$_2$ film 16 has the C-49 phase. If the temperature of the substrate 11 is set to be lower than approximately 350° C., the TiSi$_2$ film 16 has the amorphous phase.

The reason why the temperature of the substrate 11 is set to be equal to or lower than approximately 850° C. is to prevent deposited TiSi$_2$ from growing to be like islands due to agglomeration.

An example of the other sputtering condition is set as follows:

Argon (Ar) is used as the sputtering gas, the pressure of which is set as approximately 1.1 Pa. The electric power supplied to the backing plate 22 by the power supply 30 is set as, for example, 5 kW. To avoid the effect by oxygen (O$_2$) while the sputtering process is not performed, it is preferred that the inside of the chamber 20 is filled with an inert gas and at the same time, the pressure of the inert gas is held at approximately 10$^{-6}$ Pa.

Figure 3E:
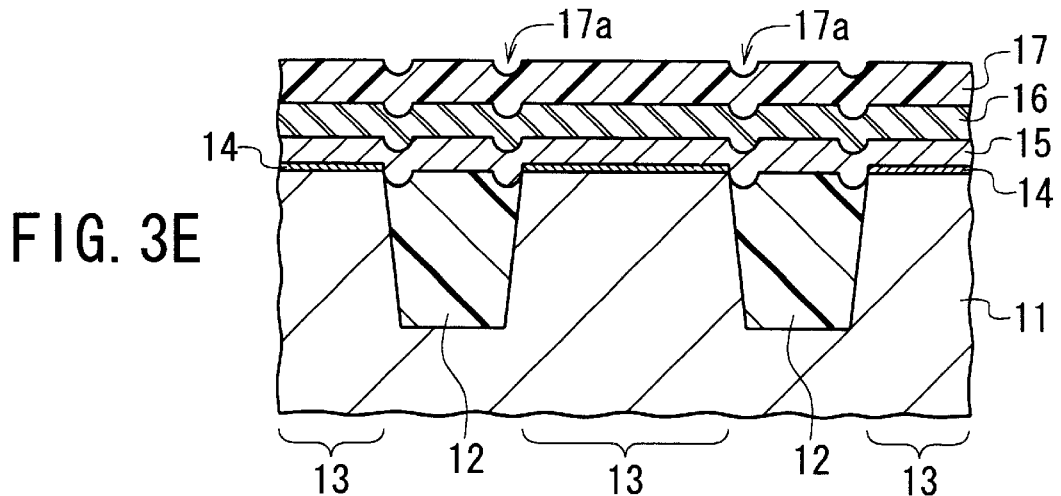

After the sputtering process is completed, the substrate 11 with the C-54 phase TiSi$_2$ film 16 thus sputtered is taken out of the sputtering apparatus 40. Then, a silicon dioxide (SiO$_2$) film 17 (e.g., approximately 150 nm in thickness) is formed on the TiSi$_2$ film 16 by a CVD method, as shown in FIG. 3E. Depressions 17a are formed on the top of the film 17 due to the depressions 16a of the film 16.

Figure 3F:
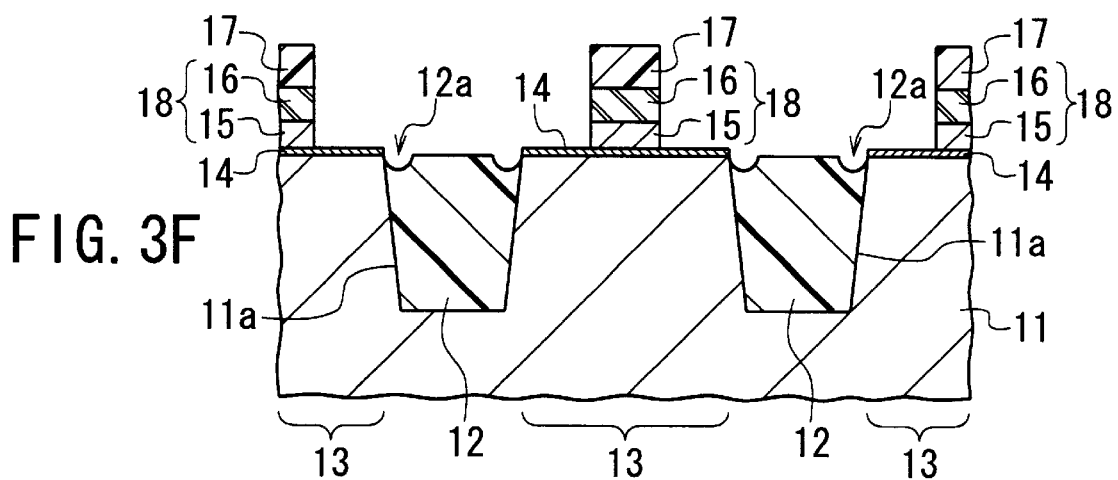

The SiO$_2$ film 17 thus formed is patterned to have a specific shape by known lithography and anisotropic dry etching methods. Following this, using the SiO$_2$ film 17 thus patterned as a mask, the underlying TiSi$_2$ and polysilicon films 16 and 15 are patterned to have the same shape as that of the SiO$_2$ film 17 by an anisotropic dry etching method. Thus, gate electrodes 18 with the TiSi$_2$ polycide structure are formed on the gate oxide 14 in the respective active regions 13, as shown in FIG. 3F.

Each gate electrode 18 is formed by the combination of the TiSi$_2$ and polysilicon films 16 and 15, in which the SiO$_2$ film 17 is located at the top of the electrode 18. At this stage, the top of the isolation dielectric 12 in the trenches 11a and part of the gate oxide 14 are exposed.

Figure 3G:
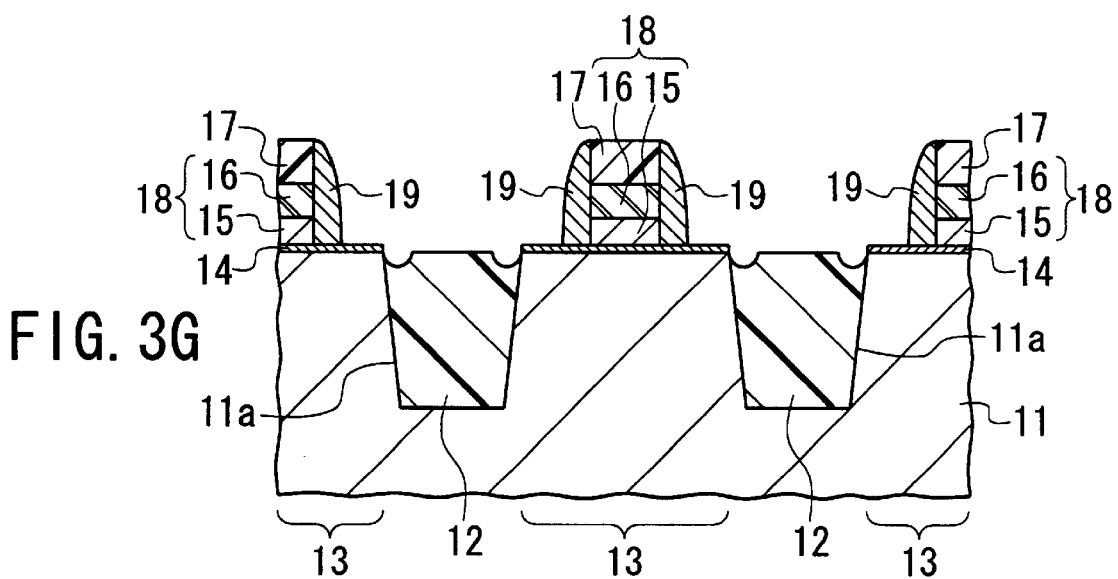

Subsequently, a SiO$_2$ film (not shown) (e.g., approximately 90 nm in thickness) is formed to cover the whole surface of the substrate 11 by a CVD method. Then, the SiO$_2$ film thus formed is etched back by an anisotropic etching method, forming sidewall spacers 19 on the exposed gate oxide 14 at each side of the gate electrodes 18, as shown in FIG. 3G.

Although not shown, pairs of source/drain regions are formed in the active regions 13 of the substrate 11. The gate electrodes 18 thus formed constitute MOSFETs in the active regions 13 along with the pairs of source/drain regions.

With the method of a semiconductor device according to the first embodiment of the invention, as explained above, the TiSi$_2$ film 16 is formed by sputtering on the n-type polysilicon film 15 while the substrate 11 is kept at a specific temperature in the range from approximately 750° C. approximately 850° C. and therefore, the TiSi$_2$ film 16 has the low-resistivity C-54 phase. In other words, the low-resistivity C-54 TiSi$_2$ film 16 is directly formed without phase transition from the high-resistivity amorphous or C-49 phase to the C-54 phase. Thus, no volume shrinkage, which tends to occur during the phase transition, occurs in the TiSi$_2$ film 16. As a result, the TiSi$_2$ film 16 can be formed without cracks at the bottoms of the depressions 16a.

Also, since the TiSi$_2$ film 16 formed through the above-described sputtering process has the low-resistivity C-54 phase, the heat treatment process to cause the phase transition of the TiSi$_2$ film 16 is unnecessary. Accordingly, the necessary time period for fabrication of the semiconductor device is shortened and the fabrication cost of the device can be lowered.

No barrier film is provided between the TiSi$_2$ film 16 and the polysilicon film 15 in the first embodiment. However, at least one proper barrier film may be formed therebetween, as explained in the following second embodiment. In this case, it is needless to say that the same advantages as those in the above-described first embodiment are given.

Although the patterned SiO$_2$ film 17 is used as a mask when the underlying TiSi$_2$ and polysilicon films 16 and 15 are patterned in the first embodiment, the invention is not limited thereto. If the SiO$_2$ film 17 is not provided, a proper mask is additionally formed and then, the underlying TiSi$_2$ and polysilicon films 16 and 15 are patterned using the mask thus formed. In this case, the gate electrode 18 is formed by the stacked films 16 and 15.

Second Embodiment

FIGS. 5A to 5G show a method of fabricating a semiconductor device according to a second embodiment of the invention, which includes the same process steps as those in the first embodiment except that a barrier film is additionally provided between the polysilicon and TiSi$_2$ films.

Figure 5A:
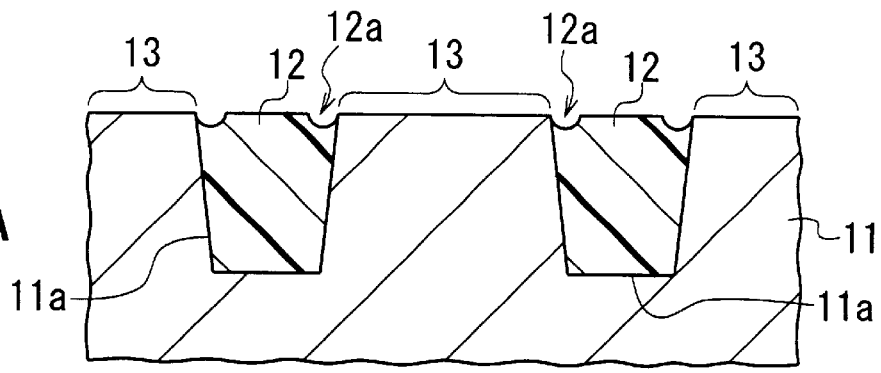
FIGS. 5A to 5G are schematic partial cross-sectional views showing the process steps of a method of fabricating a semiconductor device according to a second embodiment of the present invention, respectively.
Figure 5B:
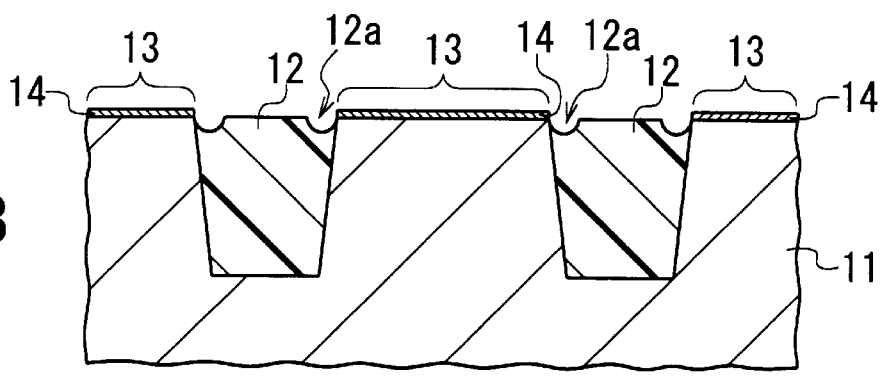
Figure 5C:
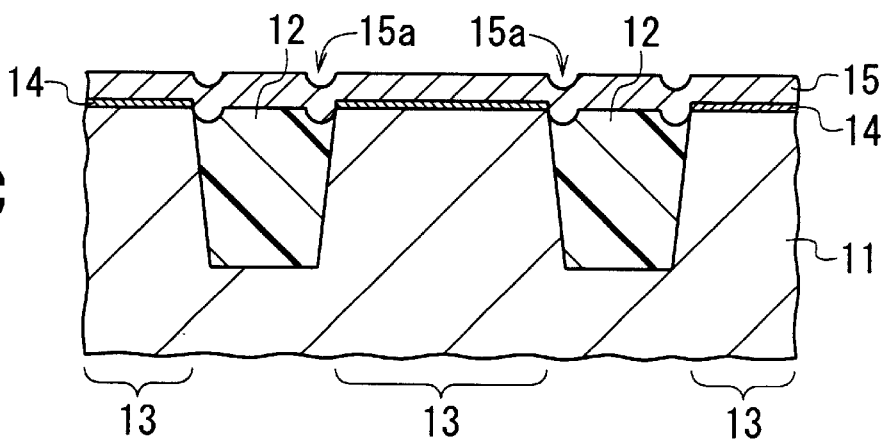

Specifically, the process steps as shown in FIGS. 5A through 5C are the same as those in the first embodiment and therefore, no explanation is provided here for the sake of simplification.

Figure 5D:
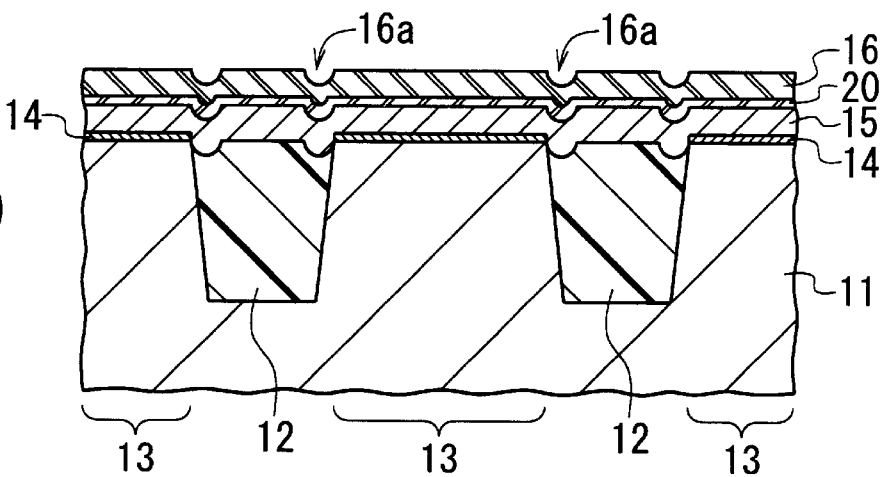

After the formation step of the n-type polysilicon film 15 on the gate oxide 14 and the exposed isolation dielectric 12, a barrier film 20 (e.g., approximately 10 nm in thickness) is formed on the polysilicon film 15 by a known method such as sputtering or CVD, as shown in FIG. 5D. As the barrier film 20, here, a titanium nitride (TiN) film is used. However, any other metal film such as a tungsten nitride (WN) film may be used for this purpose.

Following this, as shown in FIG. 5D, a TiSi$_2$ film 16 (e.g., approximately 100 nm in thickness) is formed on the TiN barrier film 20 using the sputtering apparatus 40 shown in FIG. 4 by the same sputtering method as that of the first embodiment.

Figure 5E:
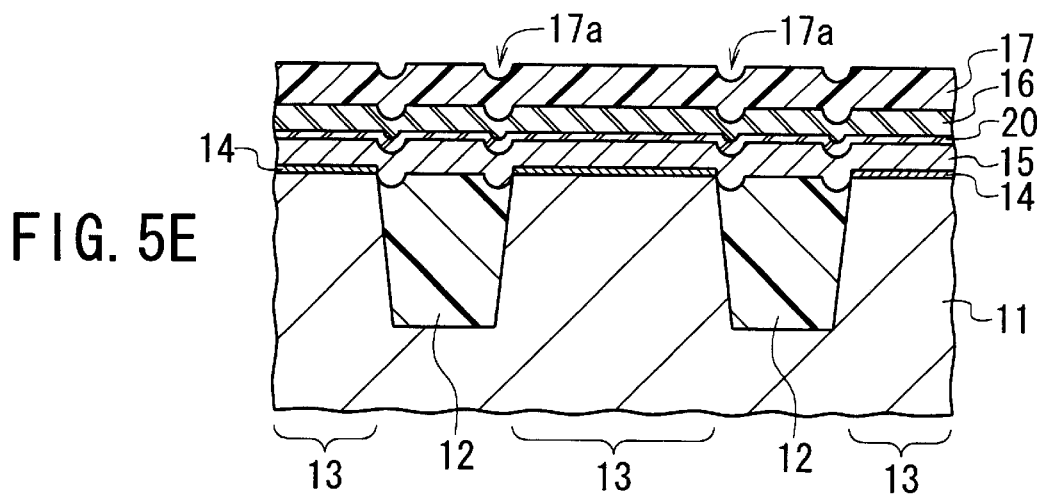

After the sputtering process is completed, the substrate 11 with the C-54 phase TiSi$_2$ film 16 thus sputtered is taken out of the sputtering apparatus 40. Then, a SiO$_2$ film 17 (e.g., approximately 150 nm in thickness) is formed on the TiSi$_2$ film 16 by a CVD method, as shown in FIG. 5E.

Figure 5F:
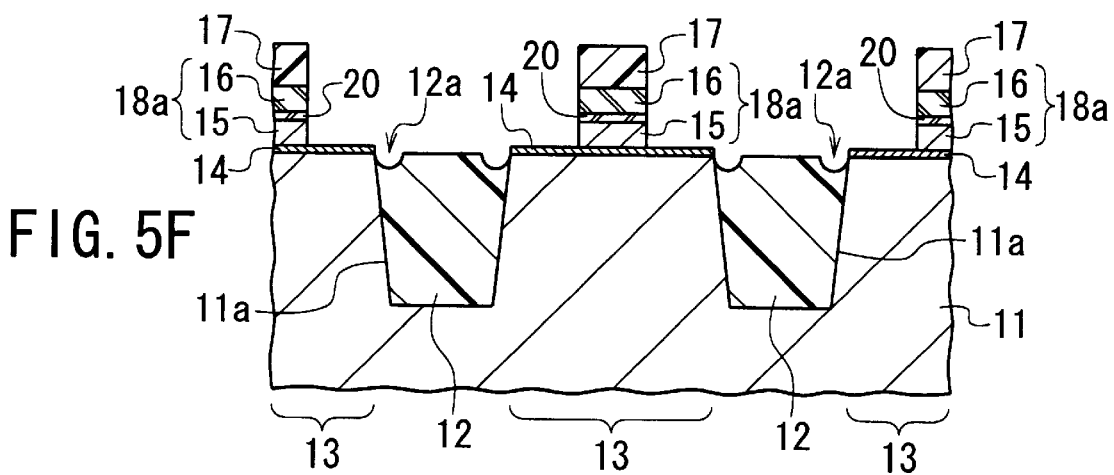

The SiO$_2$ film 17 thus formed is then patterned to have a specific shape by known lithography and anisotropic dry etching methods. Following this, using the SiO$_2$ film 17 thus patterned as a mask, the underlying TiSi$_2$, TiN, and polysilicon films 16, 20, and 15 are patterned to have the same specific shape as that of the SiO$_2$ film 17 by an anisotropic dry etching method. Thus, gate electrodes 18a with the TiSi$_2$ polycide structure are formed on the gate oxide 14 in the active regions 13, as shown in FIG. 5F.

Each gate electrode 18a is formed by the combination of the TiSi$_2$, TiN, and polysilicon films 16, 20, and 15, in which the SiO$_2$ film 17 is located at the top of the electrode 18a. At this stage, the top of the isolation dielectric 12 in the trenches 11a and part of the gate oxide 14 are exposed.

Figure 5G:
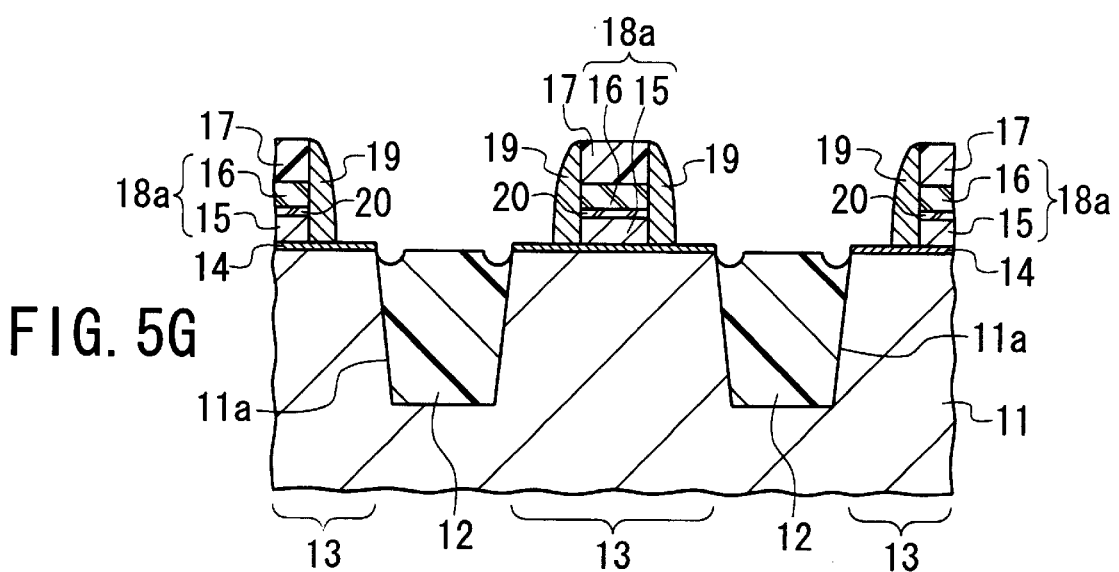

Subsequently, SiO$_2$ sidewall spacers 19 are formed on the exposed gate oxide 14 at each side of the gate electrodes 18 in the same way as that of the first embodiment, as shown in FIG. 5G, constituting MOSFETs in the active regions 13.

With the method of a semiconductor device according to the second embodiment of the invention, it is needless to say that the same advantages as those in the above-described first embodiment are given.

Similar to the first embodiment, if the SiO$_2$ film 17 is not provided, a proper mask is additionally formed and then, the underlying TiSi$_2$, TiN, and polysilicon films 16, 20, and 15 are patterned using the mask thus formed. In this case, each gate electrodea 18 is formed by the stacked films 16, 20, and 15.

Variations

In the above-described first and second embodiments, a SiO$_2$ film is used for making the etching mask for patterning the TiSi$_2$ and polysilicon films 16 and 15 and for the sidewall spacers 19. However, any other dielectric film such as a silicon nitride (SiN$_x$) film may be used for this purpose.

Also, an ultra high temperature sputtering method is used for forming the TiSi$_2$ film 16 with the low-resistivity C-54 phase in the above-described embodiments. However, any other process than sputtering may be used for this purpose. Even if a CVD or evaporation method is used, similar to the above embodiment, the TiSi$_2$ film 16 with the C-54 phase can be formed without agglomeration of TiSi$_2$ by holding the temperature of the substrate 11 at a temperature of approximately 750° C. to 850° C.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor device, comprising the steps of:
   (a) providing a semiconductor substrate having an active region defined by an isolation dielectric;
   (b) selectively forming a gate dielectric in said active region;
   (c) forming a polysilicon film on said gate dielectric;
   (d) forming a titanium silicide film in a C-54 phase on said polysilicon film while said substrate is kept at a temperature of approximately 750° C. or higher, said C-54 phase being formed when said titanium silicide film is deposited on said polysilicon film; and
   (e) patterning said polysilicon film and said C-54 phase titanium silicide film to form a gate electrode with a polycide structure.

2. The method according to claim 1, wherein in the step (d), the temperature of said substrate has a highest value of approximately 850° C.

3. The method according to claim 1, wherein the step (d) is performed by one selected from the group consisting of sputtering, CVD, and evaporation methods.

4. A method of fabricating a semiconductor device, comprising the steps of:
   (a) providing a semiconductor substrate having an active region defined by an isolation dielectric;
   (b) selectively forming a gate dielectric in said active region;
   (c) forming a polysilicon film on said gate dielectric;
   (d) forming a C-54 phase titanium silicide film on said polysilicon film while said substrate is kept at a temperature of approximately 750° C. or higher; and
   (e) patterning said polysilicon film and said C-54 phase titanium silicide film to form a gate electrode with a polycide structure,
   wherein in the step (d), no phase transition of TiSi$_2$ from the amorphous or C-49 phase to the C-54 phase occurs.

5. A method of fabricating a semiconductor device, comprising the steps of:
   (a) providing a semiconductor substrate having an active region defined by an isolation dielectric;
   (b) selectively forming a gate dielectric in said active region;
   (c) forming a polysilicon film on said gate dielectric;
   (d) forming a barrier film on said polysilicon film;
   (e) forming TiSi$_2$ film in a C-54 phase on said barrier film while said substrate is kept at a temperature of approximately 750° C. or higher, said C-54 phase being formed when said TiSi$_2$ film is deposited on said barrier film; and
   (f) patterning said polysilicon film, said barrier film, and said C-54 phase TiSi$_2$ film to form a gate electrode with a polycide structure.

6. The method according to claim 5, wherein in the step (e), the temperature of said substrate has a highest value of approximately 850° C.

7. The method according to claim 5, wherein the step (e) is performed by one selected from the group consisting of sputtering, CVD, and evaporation methods.

8. A method of fabricating a semiconductor device, comprising the steps of:
   (a) providing a semiconductor substrate having an active region defined by an isolation dielectric;
   (b) selectively forming a gate dielectric in said active region;
   (c) forming a polysilicon film on said gate dielectric;
   (d) forming a barrier film on said polysilicon film;
   (e) forming a C-54 phase TiSi$_2$ film on said barrier film while said substrate is kept at a temperature of approximately 750° C. or higher; and
   (f) patterning said polysilicon film, said barrier film, and said C-54phase TiSi$_2$ film to form a gate electrode with a polycide structure,
   wherein in the step (e), no phase transition of TiSi$_2$ from amorphous or C-49 phase to the C-54 phase occurs.

* * * * *